US007723983B2

(12) United States Patent
Shoji

(10) Patent No.: US 7,723,983 B2
(45) Date of Patent: May 25, 2010

(54) MAGNETIC SENSOR AND CURRENT SENSOR

(75) Inventor: Shigeru Shoji, Tokyo (JP)

(73) Assignee: TDK Corporation, Tokyo (JP)

( * ) Notice: Subject to any disclaimer, the term of this patent is extended or adjusted under 35 U.S.C. 154(b) by 982 days.

(21) Appl. No.: 11/453,972

(22) Filed: Jun. 16, 2006

(65) Prior Publication Data
US 2006/0291106 A1    Dec. 28, 2006

(30) Foreign Application Priority Data
Jun. 27, 2005    (JP) .............................. 2005-187384

(51) Int. Cl.
*G01R 33/02* (2006.01)
(52) U.S. Cl. ................................... 324/252
(58) Field of Classification Search ............ 324/207.21, 324/252
See application file for complete search history.

(56) References Cited

U.S. PATENT DOCUMENTS

| | | | |
|---|---|---|---|
| 5,621,377 | A | 4/1997 | Dettmann et al. |
| 5,701,223 | A | 12/1997 | Fontana, Jr. et al. |
| 6,255,814 | B1* | 7/2001 | Shimazawa et al. ......... 324/252 |
| 6,452,385 | B1 | 9/2002 | Shimazawa et al. |
| 6,631,057 | B1 | 10/2003 | Allenspach et al. |

2002/0034056 A1    3/2002    Chen et al.

FOREIGN PATENT DOCUMENTS

JP    2006-047005 A    2/2006

OTHER PUBLICATIONS

Partial European Search Report issued Feb. 15, 2010 in EP 06 01 3159.

* cited by examiner

*Primary Examiner*—Reena Aurora
(74) *Attorney, Agent, or Firm*—Oliff & Berridge, PLC

(57) ABSTRACT

The present invention provides a current sensor capable of detecting a current magnetic field generated by a current to be detected with high precision and stability while realizing a compact configuration. The current sensor has: first and second magnetoresistive elements each including a pinned layer having a magnetization direction pinned in a predetermined direction, a free layer whose magnetization direction changes according to applied magnetic fields, and an intermediate layer sandwiched between the pinned layer and the free layer; and first and second permanent magnets for applying bias magnetic fields to the first and second magnetoresistive elements. The bias magnetic field has a parallel component parallel to a magnetization direction under no magnetic field and an orthogonal component orthogonal to the parallel component. Consequently, uniaxial anisotropy of the free layer can be enhanced without using shape anisotropy. Therefore, the current magnetic field to be detected can be detected with high precision and stability irrespective of the shapes of the magnetoresistive elements, and the invention is favorable for miniaturization.

10 Claims, 16 Drawing Sheets

MAGNETIC SENSOR AND CURRENT SENSOR

BACKGROUND OF THE INVENTION

1. Field of the Invention

The present invention relates to a magnetic sensor capable of sensing a change in magnetic field with high sensitivity and a current sensor capable of sensing a change in current flowing through a conductor with high sensitivity.

2. Description of the Related Art

Generally, to accurately detect weak control current flowing through a circuit in control equipment, a method of connecting resistors in series in the circuit and measuring a voltage drop in the resistors is used. In this case, however, a load different from that of a control system is applied and there is the possibility that an adverse influence is exerted on the control system. Consequently, a method of performing indirect measurement by detecting the gradient of a current magnetic field generated by the control current is used. As a concrete example, there is a method of winding a line to be measured around a toroidal core, supplying control current to the line to be measured, and detecting a magnetic flux generated in the center portion of the toroidal core by a hall element.

With respect to a current sensor realizing the method, however, problems such as difficulty of realizing miniaturization and insufficient linearity or high frequency responsiveness are pointed out. To address the problems, a current sensor has been proposed in which a giant magnetoresistive element (hereinbelow, GMR element) producing giant magnetoresistive effect is disposed in the current magnetic field generated by control current and the gradient of the current magnetic field is detected (refer to, for example, U.S. Pat. No. 5,621,377). In relation to the current sensor, a technique of performing flaw detection on the surface of a metal substrate or the like by using a magnetic sensor having a GMR element is also disclosed. Such a magnetic sensor or a current sensor using such a GMR element has relatively improved detection sensitivity and responsiveness and obtains detection characteristics which are stable even the temperature changes.

SUMMARY OF THE INVENTION

Recently, a magnetic sensor capable of detecting weaker magnetic flux and a current sensor capable of detecting weaker current, each having a more compact general configuration are being strongly demanded. However, with miniaturization, even a magnetic sensor and a current sensor each using the GMR element are becoming more susceptible to noise from outside (unnecessary magnetic field or the like). Accordingly, there is a challenge to improve stability in detection sensitivity and responsiveness. Although some attempts such as increase in shape anisotropy by setting the shape of the GMR element to an elongated rectangular shape have been made, it cannot be said that the magnetic sensor and the current sensor have achieved the sufficiently stable performance level.

The present invention has been achieved in consideration of such problems and it is desirable to provide a magnetic sensor capable of sensing a magnetic field to be detected with high precision and stability while realizing a compact configuration.

It is also desirable to provide a current sensor capable of sensing a current magnetic field generated by a current to be detected with high precision and stability while realizing a compact configuration.

A magnetic sensor of an embodiment of the invention has: a magnetoresistive element that includes a pinned layer having a magnetization direction pinned in a predetermined direction, a free layer whose magnetization direction changes according to applied magnetic fields, and an intermediate layer sandwiched between the pinned layer and the free layer; and a bias applying means applying a bias magnetic field to the magnetoresistive element, the bias magnetic field having a parallel component parallel to the magnetization direction of the free layer under no magnetic field and an orthogonal component orthogonal to the parallel component.

A current sensor of an embodiment of the invention has: first and second magnetoresistive elements each including a pinned layer having a magnetization direction pinned in a predetermined direction, a free layer whose magnetization direction changes according to applied magnetic fields and is parallel to the magnetization direction of the pinned layer under no magnetic field, and an intermediate layer sandwiched between the pinned layer and the free layer, the first and second magnetoresistive elements being disposed along a conductor so that resistance values change in directions opposite to each other in accordance with a current magnetic field generated by a current to be detected flowing through the conductor; a bias applying means applying a bias magnetic field to the first and second magnetoresistive elements, the bias magnetic field having a parallel component parallel to the magnetization direction of the free layer under no magnetic field and an orthogonal component orthogonal to the parallel component; first and second constant current sources that supply constant currents of values equal to each other to the first and second magnetoresistive elements, respectively; and a differential detector that detects the difference between voltage drops occurring in the first and second magnetoresistive elements by the constant current, and the current to be detected is detected on the basis of the difference between the voltage drops.

In the magnetic sensor and the current sensor according to an embodiment of the invention, the bias applying means applies a bias magnetic field to the magnetoresistive elements, the bias magnetic field including an orthogonal component orthogonal to the magnetization direction of the free layer under no magnetic field and a parallel component parallel to the magnetization direction of the free layer under no magnetic field. Consequently, uniaxial anisotropy of the free layer is enhanced without using shape anisotropy.

In the magnetic sensor and the current sensor of an embodiment of the invention, the bias applying means may be one or more permanent magnets or one or more solenoid coils.

In the magnetic sensor of an embodiment of the invention, preferably, the magnetization direction of the free layer under no magnetic field is parallel to that of the pinned layer. The expression "parallel" is a concept that, desirably, the angle formed by the magnetization directions is strictly zero but a deviation of the angle of about an error that occurs in manufacture is permitted. In this case, the free layer has an axis of easy magnetization parallel to the magnetization direction of the pinned layer. Preferably, magnetic flux density of a composite magnetic field lies in the range from $22 \times 10^{-4}$ tesla (T) to $52 \times 10^{-4}$ tesla (T), the composite magnetic field being composed of an exchange bias magnetic field and the parallel component of the bias magnetic field, the exchange bias magnetic field being generated between the pinned layer and the free layer. The magnetic flux density of the orthogonal component of the bias magnetic field lies, preferably, in the range from $15 \times 10^{-4}$ tesla (T) to $45 \times 10^{-4}$ tesla (T).

The magnetic sensor of an embodiment of the invention may be also constructed so that the magnetization direction of the free layer under no magnetic field is orthogonal to that of the pinned layer.

In the current sensor of an embodiment of the invention, desirably, the free layer has an axis of easy magnetization parallel to the magnetization direction of the pinned layer. Preferably, magnetic flux density of a composite magnetic field lies in the range from $22 \times 10^{-4}$ tesla (T) to $52 \times 10-4$ tesla (T), the composite magnetic field being composed of an exchange bias magnetic field and the parallel component of the bias magnetic field, the exchange bias magnetic field being generated between the pinned layer and the free layer. Preferably, magnetic flux density of the orthogonal component of the bias magnetic field lies in the range from $15 \times 10^{-4}$ tesla (T) to $45 \times 10^{-4}$ tesla (T).

The magnetic sensor of an embodiment of the invention has the bias applying means applying a bias magnetic field to the magnetoresistive element, and the bias magnetic field includes a parallel component parallel to the magnetization direction of the free layer under no magnetic field and an orthogonal component orthogonal to the free layer. Consequently, uniaxial anisotropy of the free layer can be enhanced without using shape anisotropy. Therefore, the magnetic field to be detected can be detected with high precision and stability irrespective of the shapes of the magnetoresistive elements, and the invention is favorable for miniaturization.

The current sensor of an embodiment of the invention has the bias applying means applying a bias magnetic field to first and second magnetoresistive elements disposed along a conductor so that resistance values change in directions opposite to each other in accordance with a current magnetic field generated by a current to be detected which flows through the conductor, and the bias magnetic field includes a parallel component parallel to the magnetization direction of the free layer under no magnetic field and an orthogonal component orthogonal to the parallel component. Consequently, uniaxial anisotropy of the free layer can be enhanced without using shape anisotropy. Further, the current to be detected is detected on the basis of the difference between a voltage drop which occurs in the first magnetoresistive element and a voltage drop which occurs in the second magnetoresistive element when constant currents of the same value are supplied. Thus, the current magnetic field generated by the current to be detected can be detected with high precision and stability while realizing a compact configuration.

Other and further objects, features, and advantages of the invention will appear more fully from the following description.

DETAILED DESCRIPTION OF THE PREFERRED EMBODIMENTS

An embodiment of the present invention will be described in detail hereinbelow with reference to the drawings.

Figure 1:
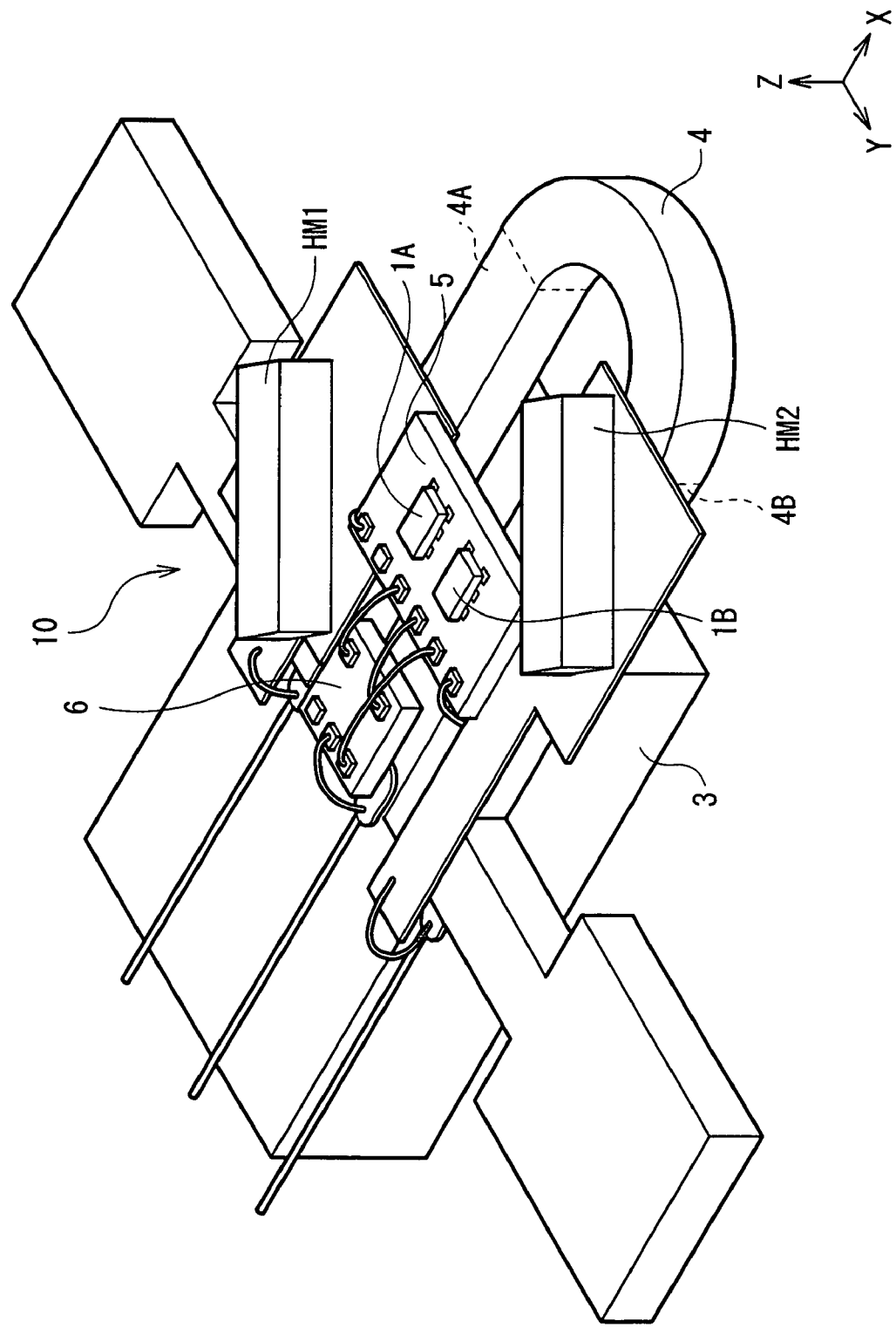
FIG. 1 is a perspective view showing the configuration of a current sensor according to an embodiment of the invention.
Figure 2:
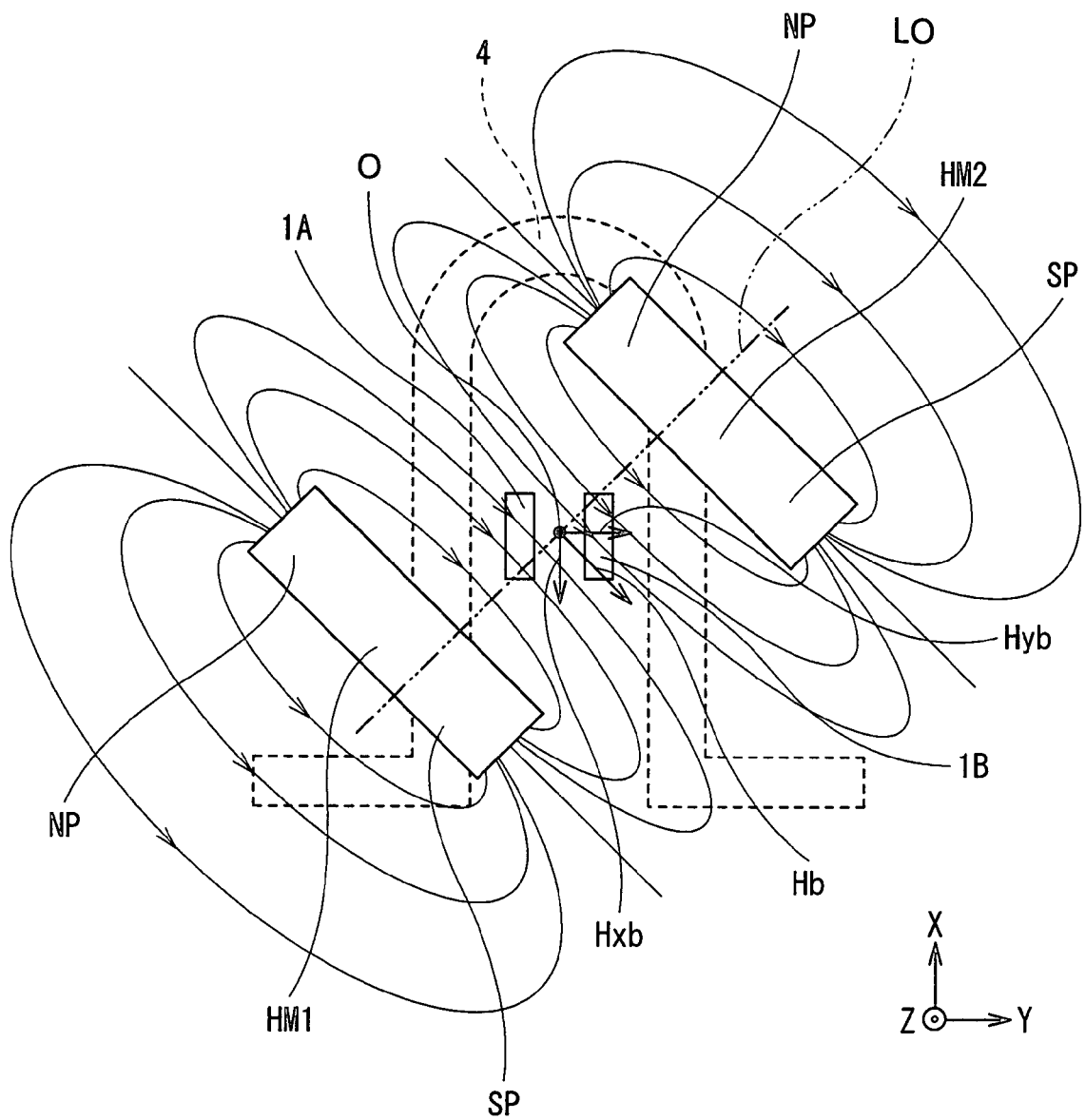
FIG. 2 is an explanatory diagram illustrating a state of a bias magnetic field in the current sensor shown in FIG. 1.
Figure 3:
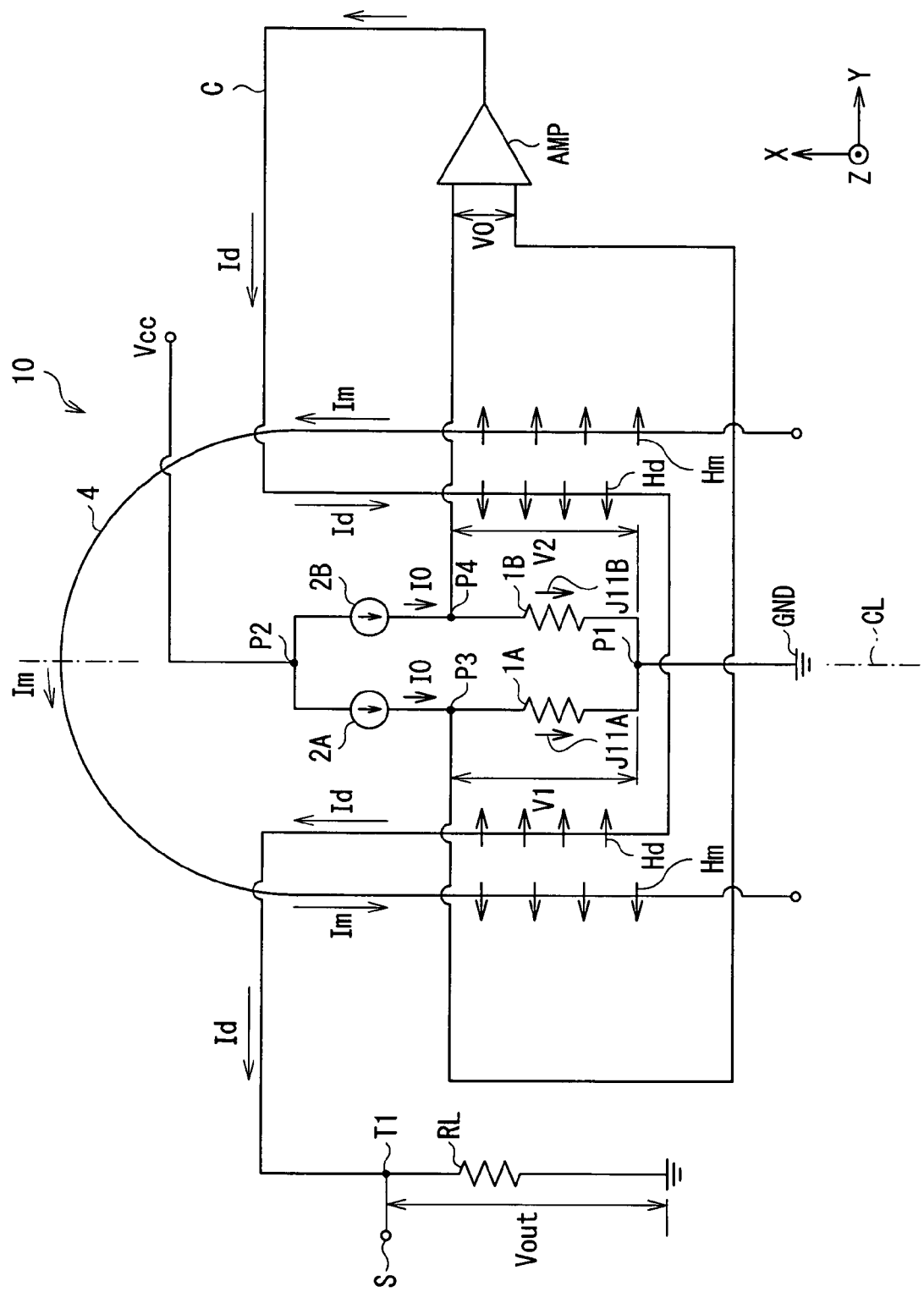
FIG. 3 is a circuit diagram of the current sensor illustrated in FIG. 1.

First, the configuration of a current sensor as an embodiment of the invention will be described by referring to FIGS. 1 to 3. FIG. 1 is a schematic view illustrating a perspective configuration of a current sensor 10 according to the embodiment. FIG. 2 is a schematic view showing a plan view configuration of the current sensor 10 of FIG. 1. FIG. 3 shows a circuit configuration of the current sensor 10 of FIG. 1. All of arrows of a current Im to be detected, a compensation current Id, a current magnetic field Hm, a compensation current magnetic field Hd, bias magnetic fields Hb1 and Hb2, and a current I0 (which will be described later) in FIG. 3 show directions relative to first and second magnetoresistive elements.

The current sensor 10 is an ammeter for measuring the current Im to be detected supplied to a conductor 4 formed on a substrate 3, and has first and second magnetoresistive elements 1A and 1B connected to each other at a first connection point P1 (hereinbelow, simply called the magnetoresistive elements 1A and 1B). The magnetoresistive elements 1A and 1B are disposed line-symmetrically with respect to a center line CL as an axis of symmetry passing through an intermediate point on a virtual straight line connecting the magnetoresistive elements 1A and 1B and extend along the center line CL (X-axis direction in the diagram). The conductor 4 includes a U-shaped portion having a pair of parallel parts 4A and 4B. The parallel parts 4A and 4B of the pair are disposed in line symmetry with respect to the center line CL as an axis of symmetry in a plane parallel to a plane including the magnetoresistive elements 1A and 1B, and extend in parallel with each other along the center line CL. With the configuration, as shown by the arrows in FIG. 3, the current magnetic field Hm generated by the current Im to be detected is applied in the −Y direction to the magnetoresistive element 1A and is applied in the +Y direction to the magnetoresistive element 1B. Specifically, the magnetoresistive elements 1A and 1B are disposed so that the current magnetic fields Hm make resistance values R1 and R2 of the magnetoresistive elements 1A and 1B change in the directions opposite to each other at the time of driving of the current sensor 10. Moreover, the distance from the parallel part 4A to the magnetoresistive element 1A is equal to that from the parallel part 4B to the magnetoresistive element 1B in the conductor 4, so that absolute values of the current magnetic fields Hm applied to the magnetoresistive elements 1A and 1B are equal to each other. Both of the magnetoresistive elements 1A and 1B are formed on a circuit board 5 provided over the conductor 4.

The current sensor 10 also has a constant current source 2A (first constant current source) and a constant current source 2B (second constant current source) whose one ends are connected to each other at a second connection point P2. The constant current source 2A is connected to an end on the side opposite to the first connection point P1 in the magnetoresistive element 1A at a third connection point P3. The other constant current source 2B is connected to an end on the side opposite to the first connection point p1 in the magnetoresistive element 1B at a fourth connection point P4. More concretely, the magnetoresistive element 1A and the constant current source 2A are connected to each other in series along the center line CL, and the magnetoresistive element 1B and the constant current source 2B are connected to each other in series along the center line CL. They are disposed so as to align in the direction (Y axis direction) orthogonal to the center line CL and connected in parallel with each other. The constant current sources 2A and 2B are constructed so as to supply the constant currents I0 whose values are equal to each other to the magnetoresistive elements 1A and 1B, respectively. The constant current sources 2A and 2B are formed in a circuit board 6 provided over the substrate 3.

Permanent magnets HHM1 and HHM2 as bias applying means are disposed so as to face each other while sandwiching the magnetoresistive elements 1A and 1B in the X·Y plane (refer to FIGS. 1 and 2). As shown in FIG. 2, the permanent magnets HHM1 and HHM2 are parallel with each other so that their north poles NP and south poles SP are directed in the same directions, thereby enhancing their magnetic fluxes. The permanent magnets HHM1 and HHM2 apply bias magnetic fields Hb to the magnetoresistive elements 1A and 1B (refer to FIG. 2). The bias magnetic field Hb applied to the magnetoresistive elements 1A and 1B can be divided into a parallel component Hxb parallel to a magnetization direction J13 of a free layer 13 (which will be described later) and an orthogonal component Hyb orthogonal to the magnetization direction J13 of the free layer 13. In this case, the orthogonal component Hyb corresponds to the induction direction of each of the magnetoresistive elements 1A and 1B. The magnetic flux density of a composite magnetic field between an exchange bias magnetic field Hin (which will be described later) generated between a pinned layer 11 and the free layer 13 (which will be described later) and the parallel component Hxb in the bias magnetic field Hb is preferably in the range from $22 \times 10^{-4}$ tesla (T) to $52 \times 10^{-4}$ tesla (T). On the other hand, the magnetic flux density of the orthogonal component Hyb in the bias magnetic field is preferable in the range from $15 \times 10^{-4}$ tesla (T) to $45 \times 10^{-4}$ tesla (T).

Moreover, the current sensor 10 has a compensation current line C, and the compensation current Id based on a potential difference between the third connection point P3 and the fourth connection point P4 when a voltage is applied across the first and second connection points P1 and P2 is supplied to the compensation current line C (refer to FIG. 3). The input side of the compensation current line C is connected to the output side of a differential amplifier AMP as a differential detector connected to the third and fourth connection points P3 and P4, and the other end is grounded via a resistor RL. On the side of the differential amplifier AMP in the resistor RL, a compensation current detecting means S is connected at a connection point T1. The compensation current line C is constructed so that the compensation current Id gives the compensation current magnetic fields Hd to the magnetoresistive elements 1A and 1B. The direction of the compensation current magnetic field Hd is opposite to that of the current magnetic field Hm generated by the current Im to be detected. That is, the compensation current magnetic fields Hd generated by the compensation current Id are applied, as shown by arrows in FIG. 3, in the +Y direction to the magnetoresistive element 1A and in the −Y direction to the magnetoresistive element 1B.

Figure 4:
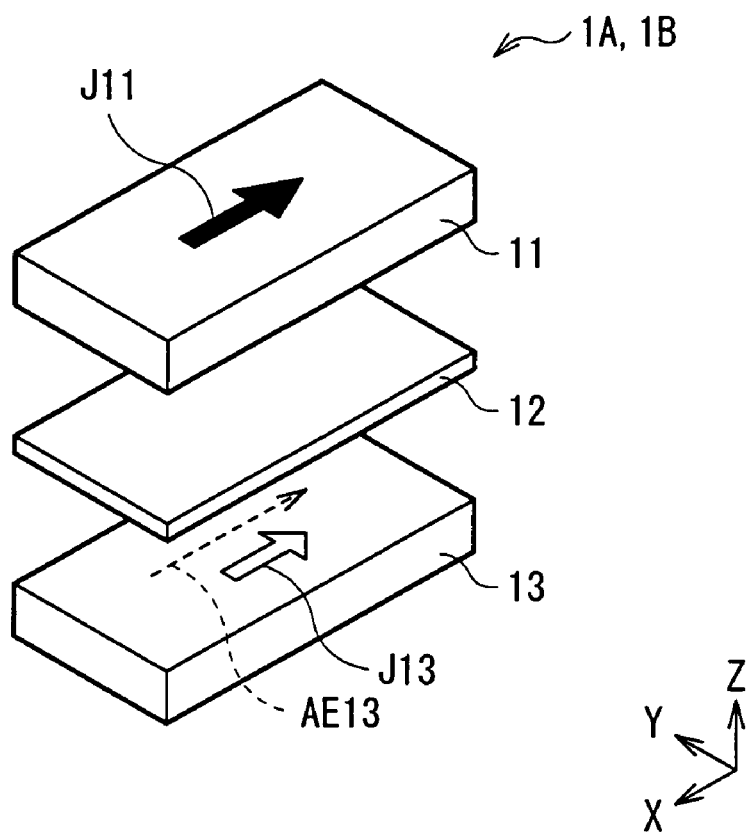
FIG. 4 is an exploded perspective view showing the configuration of a magnetoresistive element as a main part of the current sensor illustrated in FIG. 1.

Next, referring to FIG. 4, the configuration of the magnetoresistive elements 1A and 1B will be described more specifically. FIG. 4 is an exploded perspective view of the magnetoresistive elements 1A and 1B.

As shown in FIG. 4, the magnetoresistive elements 1A and 1B are GMR elements each having a spin valve structure in which a plurality of function films including magnetic layers are stacked. Each of the magnetoresistive elements 1A and 1B includes a pinned layer 11 having a magnetization direction J11 pinned in a direction (the −X direction in the diagram) along the center line CL, a free layer 13 whose magnetization direction changes according to external magnetic fields H such as the current magnetic fields Hm, and an intermediate layer 12 which is sandwiched between the pinned layer 11 and the free layer 13 and does not show any specific magnetization direction. The free layer 13 is made of a soft magnetic material such as nickel iron alloy (NiFe). The intermediate layer 12 is made of copper (Cu), whose top face is in contact with the pinned layer 11 and whose bottom face is in contact with the free layer 13. The intermediate layer 12 can be made of not only copper but also a nonmagnetic metal having high electric conductivity such as gold (Au). Each of the top face of the pinned layer 11 (the face on the side opposite to the intermediate layer 12) and the under face of the free layer 13 (the face on the side opposite to the intermediate layer 12) is provided with a not-shown protection film. Between the pinned layer 11 and the free layer 13, exchange bias magnetic fields Hin in the magnetization direction J11 (hereinbelow, simply called "exchange bias magnetic fields Hin") are generated and act each other via the intermediate layer 12. The strength of the exchange bias magnetic field Hin changes as the spin direction in the free layer 13 rotates according to the interval between the pinned layer 11 and the free layer 13 (that is, the thickness of the intermediate layer 12). In this case, the direction of the exchange bias magnetic field Hin is the −X direction. Although FIG. 4 shows a configuration example of the case where the free layer 13, the intermediate layer 12, and the pinned layer 11 are stacked in order from the bottom, the invention is not limited to the configuration. The layers may be stacked in the opposite order.

Figure 5:
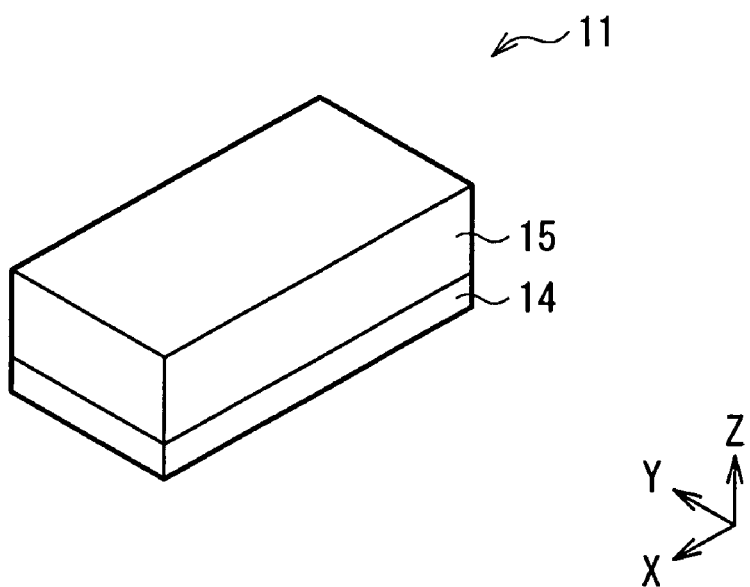
FIG. 5 is a perspective view showing the configuration of a part of the magnetoresistive element illustrated in FIG. 4.

FIG. 5 shows a detailed configuration of the pinned layer 11. The pinned layer 11 has a configuration in which a magnetization pinned film 14 and an antiferromagnetic film 15 are stacked in order from the side of the intermediate layer 12. The magnetization pinned film 14 is made of ferromagnetic material such as cobalt (Co) or cobalt iron alloy (CoFe). The magnetization direction of the magnetization pinned film 14 is the magnetization direction J11 of the pinned layer 11 as a whole. The antiferromagnetic film 15 is made of antiferromagnetic material such as platinum manganese alloy (PtMn) or iridium manganese alloy (IrMn). The antiferromagnetic film 15 is in the state where the spin magnetic moment in the −X direction and that in the opposite direction (+X direction) completely cancel out each other, and functions so as to pin the magnetization direction J11 of the magnetization pinned film 14.

In the magnetoresistive elements 1A and 1B constructed as described above, by application of the current magnetic field Hm, the magnetization direction J13 of the free layer 13 rotates, thereby changing a relative angle between the magnetization directions J13 and J11. The relative angle is determined according to the magnitude and the direction of the current magnetic field Hm.

Figure 6:
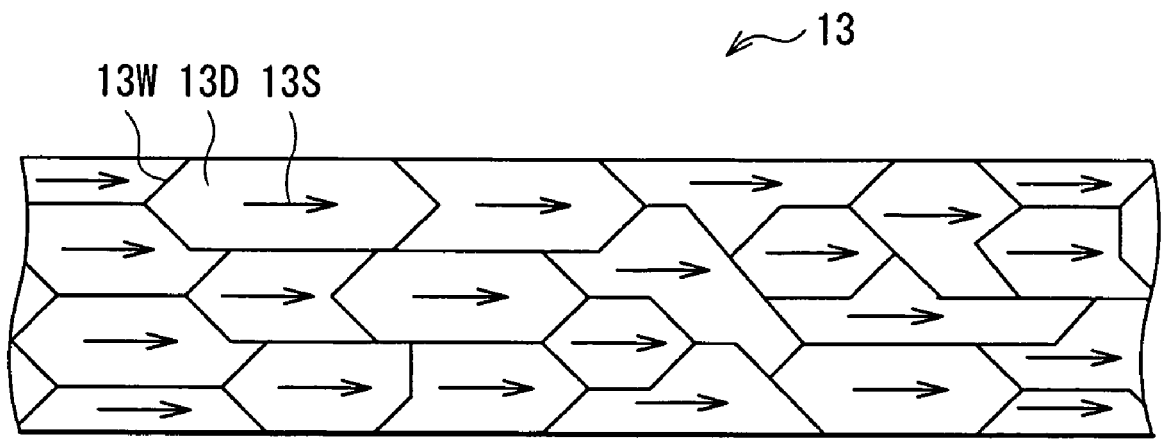
FIG. 6 is a schematic diagram showing spin distribution in a free layer of the magnetoresistive element illustrated in FIG. 4.

FIG. 4 shows a no load state where the current magnetic field Hm is zero (Hm=0) and the bias magnetic fields Hb generated by the permanent magnets HHM1 and HHM2 are not applied (that is, the state where the external magnetic field H is zero). Since an easy magnetization axis direction AE13 of the free layer 13 is set in parallel to the magnetization direction J11 of the pinned layer 11, all of the easy magnetization axis direction AE13 and the magnetization directions J13 and J11 are parallel to each other along the −X direction in this state. Consequently, the spin directions of magnetic domains in the free layer 13 align in almost the same direction. FIG. 6 is a conceptual diagram schematically showing the spin directions of the magnetic domains in the free layer 13. The free layer 13 has, as shown in FIG. 6, a plurality of domains 13D partitioned by domain walls 13W and whose spins 23S align in almost the same direction (the magnetization direction J13).

Figure 7:
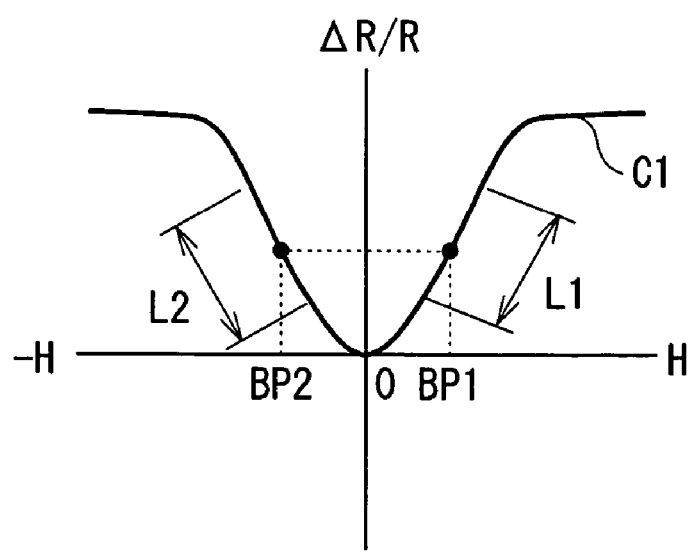
FIG. 7 is a characteristic diagram showing magnetic field dependency of a resistance change ratio in the magnetoresistive element illustrated in FIG. 4.

When the magnetic field H are applied to the magnetoresistive elements 1A and 1B each having the free layer 13 in which the spin directions align as described above in a direction (+Y direction or −Y direction) orthogonal to the magnetization direction J11, the characteristic shown in FIG. 7 is obtained. FIG. 7 shows the relation between the magnetic field H and the resistance change rate ΔR/R when the magnetic field H in the +Y direction is assumed to be positive. The relation is the smallest (ΔR/R=0) when the magnetic field H is zero, and is expressed by a curve C1 which hardly shows hysteresis. In this case, 1/f noise caused by hysteresis is extremely small, so that high-sensitive and stable sensing can be performed.

Figure 8:
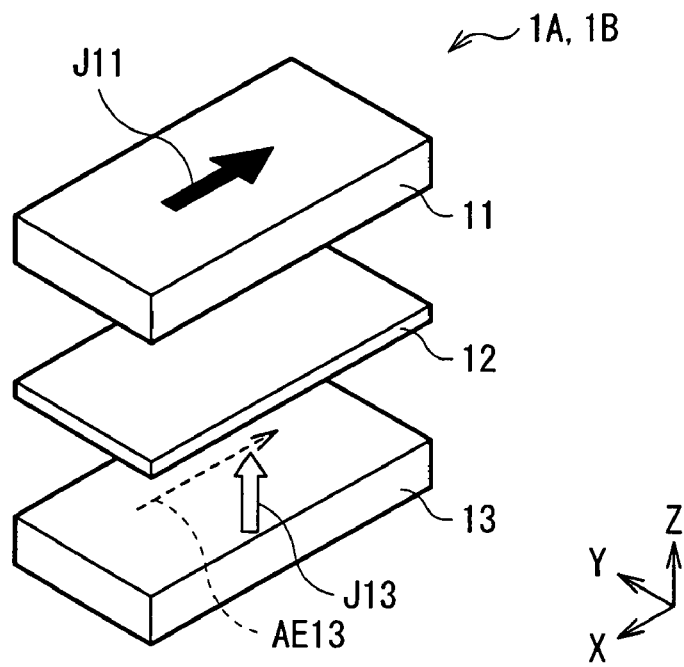
FIG. 8 is another exploded perspective view showing the configuration of the magnetoresistive element as a main part of the current sensor illustrated in FIG. 1.

As is evident from FIG. 7, however, a linear change may not be obtained in a range around zero of the magnetic field H (H=0). Therefore, in the case of actually measuring the current magnetic field Hm, the bias magnetic field Hb generated by the permanent magnets HHM1 and HHM2 is applied to the magnetoresistive elements 1A and 1B and, as shown in FIG. 8, the magnetization direction J13 is turned and slightly tilted so as to include a component in the +Y direction or a component in the −Y direction (FIG. 8 shows the case where the magnetization direction J13 is tilted to the +Y direction). In such a manner, in linear areas L1 and L2 whose centers are bias points BP1 and BP2, respectively, shown in FIG. 7, a change in the current magnetic field Hm can be detected with high precision. In the current sensor 10, the magnetization directions J11 in the pinned layers 11 of the magnetoresistive elements 1A and 1B are the same direction (−X direction) and the bias magnetic field Hb having the orthogonal component Hyb in the +Y direction is applied to both of the magnetoresistive elements 1A and 1B. Consequently, when the current magnetic field Hm is detected, a resistance value R1 of the magnetoresistive element 1A and the resistance value R2 of the magnetoresistive element 1B change in directions opposite to each other. For example, the bias magnetic field Hb having the orthogonal component Hyb whose strength corresponds to that in the bias point BP1 (refer to FIG. 7) is preliminarily applied in the +Y direction to the magnetoresistive elements 1A and 1B. When the current Im to be detected is passed as shown in FIG. 3, the current magnetic field Hm in the −Y direction is applied to the magnetoresistive element 1A. Consequently, as is evident from FIG. 7, the resistance change ratio decreases (the resistance value R1 decreases). In contrast, the current magnetic field Hm in the +Y direction is applied to the magnetoresistive element 1B. Consequently, as is obvious from FIG. 7, the resistance change ratio increases (the resistance value R2 increases).

At this time, it is preferable to equalize the magnetic flux densities of the bias magnetic fields Hb applied to the magnetoresistive elements 1A and 1B to make the sensibilities of the magnetoresistive elements 1A and 1B equal to each other. For example, it is sufficient to adjust the magnetic flux densities of the bias magnetic fields Hb passing through the magnetoresistive elements 1A and 1B by properly moving the permanent magnets HHM1 and HHM2 so as to be apart from each other along their extending directions while maintaining the parallel state. Specifically, the permanent magnets HHM1 and HHM2 are moved so that the center position of the permanent magnet HHM1 (or HHM2) and the center position of the magnetoresistive element 1A (or 1B) in a relatively close position become closer to each other. Concretely, in the case where a straight line L0 passing an intermediate point O between the magnetoresistive elements 1A and 1B and orthogonal to the extending directions of the permanent magnets HHM1 and HHM2 is regarded as a reference, it is preferable to move the permanent magnet HHM1 in a direction in which the center position of magnetoresistive element 1A is deviated (that is, to the north pole NP side) and to move the permanent magnet HHM2 in a direction in which the center position of the magnetoresistive element 1B is deviated (that is, to the south pole SP side).

Further, the bias magnetic field Hb also includes the parallel component Hxb parallel to the magnetization direction J13 of the free layer 13. The parallel component Hxb enhances uniaxial anisotropy of the free layer 13 as a component corresponding to the anisotropic magnetic field and contributes to stabilization of the magnetic field detecting operation in the magnetoresistive elements 1A and 1B. Hitherto, shape anisotropy is increased by elongating the shape of the magnetoresistive element itself to an elongate shape. Further, by disposing a plurality of elongated magnetoresistive elements in parallel at predetermined intervals, the resistance change ratio is increased. In this case, however, a relatively large space is necessary and the compensation current line becomes larger. In the current sensor 10 of the embodiment, however, the shape anisotropy is not used, so that the magnetoresistive elements 1A and 1B have a high degree of flexibility in shape and each of the magnetoresistive elements 1A and 1B does not have be divided into a plurality of elements. Therefore, the detection of the current magnetic field can be performed with high precision and sufficient stability while realizing a more compact configuration.

In the current sensor 10 having such a configuration, the compensation current Id based on the potential difference V0 between the third and fourth connection points P3 and P4 (the difference between voltage drops occurring in the magnetoresistive elements 1A and 1B) when voltage is applied across the first and second connection points P1 and P2 flows in the compensation current line C via the differential amplifier AMP as a differential detector. The compensation current Id is detected by the compensation current detecting means S. The differential amplifier AMP adjusts the compensation current Id so that the difference V0 becomes zero.

A method of measuring the current magnetic field Hm generated by the current Im to be detected will be described hereinbelow with reference to FIG. 3.

In FIG. 3, constant currents from the constant current sources 2A and 2B when a predetermined voltage is applied across the first and second connection points P1 and P2 are expressed as I0, and the resistance values of the magnetoresistive elements 1A and 1B are expressed as R1 and R2, respectively. In the case where no current magnetic field Hm is applied, the potential V1 at the third connection point is expressed as follows.

$$V1 = I0 \cdot R1$$

The potential V2 at the fourth connection point P4 is expressed as follows.

$$V2 = I0 \cdot R2$$

Therefore, the potential difference between the third and fourth connection points P3 and P4 is obtained by the following equation.

$$V0 = V1 - V2 \quad (1)$$
$$= I0 \cdot R1 - I0 \cdot R2$$
$$= I0 \cdot (R1 - R2)$$

In this circuit, by measuring the potential difference V0 when the current magnetic field Hm is applied, the resistance change amount is obtained. For example, it is assumed that when the current magnetic field Hm is applied, the resistance values R1 and R2 increase only by change amounts ΔR1 and ΔR2, respectively, Equation (1) is changed as follows.

$$V0 = V1 - V2 \quad (2)$$
$$= I0 \cdot (R1 - R2)$$
$$= I0 \cdot \{(R1 + \Delta R1) - (R2 + \Delta R2)\}$$

As already described above, since the magnetoresistive elements 1A and 1B are disposed so that the current magnetic fields Hm make the resistance values R1 and R2 change in directions opposite to each other, the signs (positive and negative signs) of the change amounts ΔR1 and ΔR2 are accordingly different from each other. Therefore, in Equation (2), while the resistance values R1 and R2 before application of the current magnetic fields Hm cancel out each other, the change amounts ΔR1 and ΔR2 are maintained as they are.

When it is assumed that the magnetoresistive elements 1A and 1B have the same characteristics, that is, R1=R2=R and ΔR1=−ΔR2=ΔR, Equation (3) is changed as follows.

$$V0 = I0 \cdot (R1 + \Delta R1 - R2 - \Delta R2) \quad (4)$$
$$= I0 \cdot (R + \Delta R - R + \Delta R)$$
$$= I0 \cdot (2\Delta R)$$

Therefore, by using the magnetoresistive elements 1A and 1B whose relations between the resistance change amounts and magnetic field applied are grasped in advance, the magnitude of the current magnetic field Hm can be measured, and the magnitude of the current Im to be detected which generates the current magnetic field Hm can be estimated. In this case, since sensing is performed by using the two magnetoresistive elements 1A and 1B, the resistance change amount twice as large as that of the case of performing sensing using the magnetoresistive element 1A or 1B singly can be obtained. Thus, the invention is favorable for higher precision of a measurement value. In addition, variations in the characteristics among the magnetoresistive elements, variations in connection resistance, and the like can be suppressed more than the case of performing sensing using a bridge circuit constructed by four magnetoresistive elements. Therefore, even in the case of using high-sensitive magnetoresistive elements, balance adjustment is easy. Moreover, the number of magnetoresistive elements themselves can be also reduced and, accordingly, the number of terminals decreases, so that the invention is favorable for reduction in space.

Further, in the current sensor 10, both of the potential V1 detected at the third connection point P3 and the potential V2 detected at the fourth connection point P4 are supplied to the differential amplifier AMP, and the compensation current Id by which the difference (the potential difference V0) becomes zero is output. The compensation current Id from the differential amplifier AMP flows in the direction opposite to the current Im to be detected near the magnetoresistive elements 1A and 1B, and generates the compensation current magnetic fields Hd in the direction opposite to that of the current magnetic fields Hm, thereby acting so as to cancel an error caused by variations in the connection resistance in the circuit, variations in the characteristics between the magnetoresistive elements 1A and 1B, bias in the temperature distribution, an interference magnetic field from the outside, or the like. As a result, the magnitude of the compensation current Id becomes proportional only to the current magnetic field Hm. Therefore, the compensation current detecting means S can compute the current magnetic field Hm more accurately by measuring the output voltage V0 out and calculating the compensation current Id from the relation with the known resistor RL and, accordingly, can estimate the magnitude of the current Im to be detected with high precision.

As described above, the current sensor 10 of the embodiment has: the magnetoresistive elements 1A and 1B disposed along the conductor 4 so that resistance values R1 and R2 change in directions opposite to each other in accordance with the current magnetic field Hm generated by the current Im to be detected flowing through the conductor 4, and connected in parallel with each other; the constant current source 2A connected in series with the magnetoresistive element 1A at the third connection point P3; and the constant current source 2B connected in series with the magnetoresistive element 1B at the fourth connection point P4. The constant current sources 2A and 2B are connected to each other at the second connection point P2. The current Im to be detected is detected on the basis of the potential difference V0 between the third and fourth connection points P3 and P4 when voltage is applied across the first and second connection points P1 and P2. With the configuration, an offset value can be adjusted at the zero magnetic field more easily as compared with the case of using four magnetoresistive elements, and magnetoresistive elements having higher sensitivity can be used as the magnetoresistive elements 1A and 1B. Further, equal and stable currents can be supplied to the magnetoresistive elements 1A and 1B. Therefore, the current magnetic field Hm generated even by the weak current Im to be detected can be detected with high sensitivity and high precision. By providing the constant current sources 2A and 2B, balance adjustment including the magnetoresistive elements 1A and 1B becomes necessary but it can be electrically controlled. Consequently, as compared with the case of using four magnetoresistive elements, the balance adjustment can be performed more easily.

In particular, the current sensor 10 further includes the compensation current line C to which the compensation current Id based on the difference V0 between the potential V1 detected at the third connection point P3 and the potential V2 detected at the fourth connection point P4 (the difference between the voltage drops which occur in the magnetoresistive elements 1A and 1B) is supplied. The compensation current Id gives the compensation current magnetic field Hd in the direction opposite to that of the current magnetic field Hm to each of the magnetoresistive elements 1A and 1B. Therefore, a change in the output voltage Vout caused by variations in characteristics between the magnetoresistive elements, variations in connection resistance in the circuit, a temperature distribution, and the like can be cancelled. Thus, the current magnetic field Hm can be detected with higher sensitivity and higher precision.

Further, in the current sensor 10, the magnetoresistive elements 1A and 1B, the constant current sources 2A and 2B, and the compensation current line C are provided so as to be line-symmetrical with respect to the center line CL as a symmetry axis, and the pair of parallel parts 4A and 4B in the conductor 4 are disposed line-symmetrically with respect to the center line CL as a symmetry axis in a plane parallel to a plane including the magnetoresistive elements 1A and 1B and extend in parallel with each other along the center line CL. Thus, a temperature distribution which is symmetrical with respect to the center line CL can be obtained. Therefore, a zero point drift depending on the temperature distribution can be suppressed.

Modification

Figure 9:
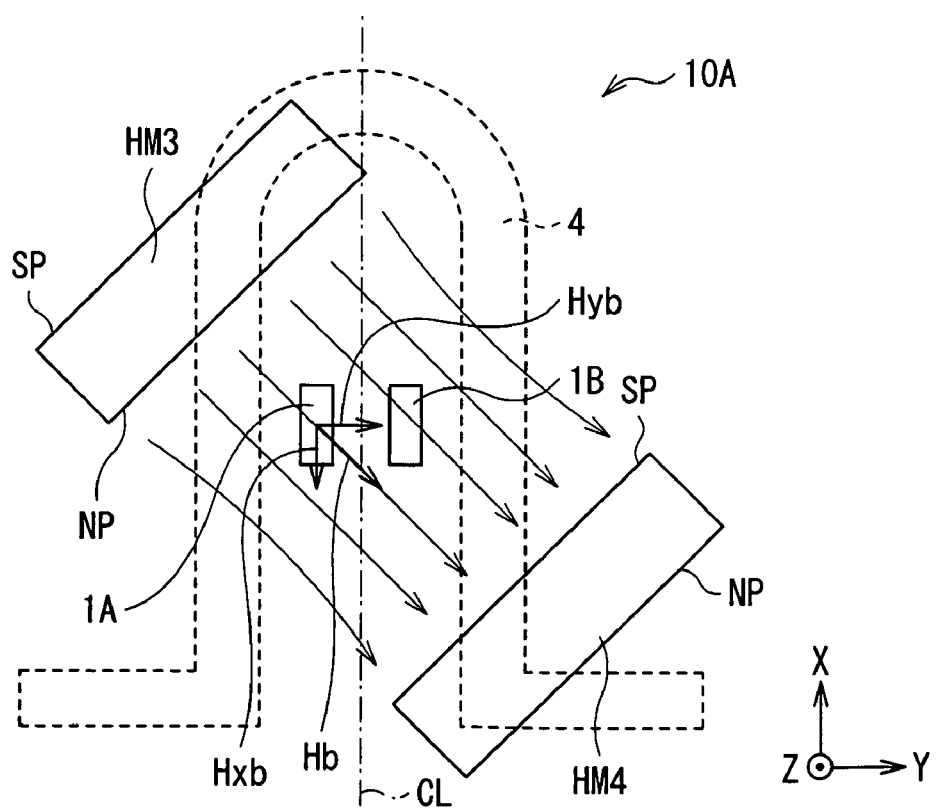
FIG. 9 is a plan view showing a schematic configuration of a modification of the current sensor illustrated in FIG. 1.

A current sensor 10A as a modification in the embodiment will be described hereinbelow with reference to FIG. 9.

In the foregoing embodiment, as shown in FIG. 2, the ends of each of the permanent magnets HHM1 and HHM2 in the longitudinal direction are set as the north pole NP and the south pole SP. Alternately, shown in FIG. 9, ends in the width direction of each of the permanent magnets HHM1 and HHM2 may be set as the north pole NP and the south pole SP. In this case, the permanent magnets HHM1 and HHM2 are disposed parallel with each other so that the north pole NP of one of them (the permanent magnet HHM1) and the south pole SP of the other permanent magnet (the permanent magnet HHM2) face each other. With such a configuration as well, the bias magnetic field Hb can be applied to the magnetoresistive elements 1A and 1B. Moreover, by changing the relative positions (distance and angle) between the magnetoresistive elements 1A and 1B and the permanent magnets HHM1 and HHM2, the magnetic flux densities of the parallel component Hxb and the orthogonal component Hyb applied to the magnetoresistive elements 1A and 1B can be adjusted.

Example

Next, an example of the invention will be described hereinbelow.

First, in the current sensor of the embodiment, a change in the resistance value R was measured in the case where each of a magnetic field Hx parallel to the magnetization direction of the pinned layer and a magnetic field Hy orthogonal to the magnetization direction of the pinned layer was applied to the magnetoresistive element. At that time, the bias magnetic field Hb including the parallel component Hxb and the orthogonal component Hyb was also applied. FIGS. 10 to 14 show the results. In this case, the positive/negative sign of the magnetic field Hx and that of the parallel component Hxb coincide with each other and, similarly, the positive/negative sign of the magnetic field Hy and that of the orthogonal component Hyb coincide with each other.

Figure 10:
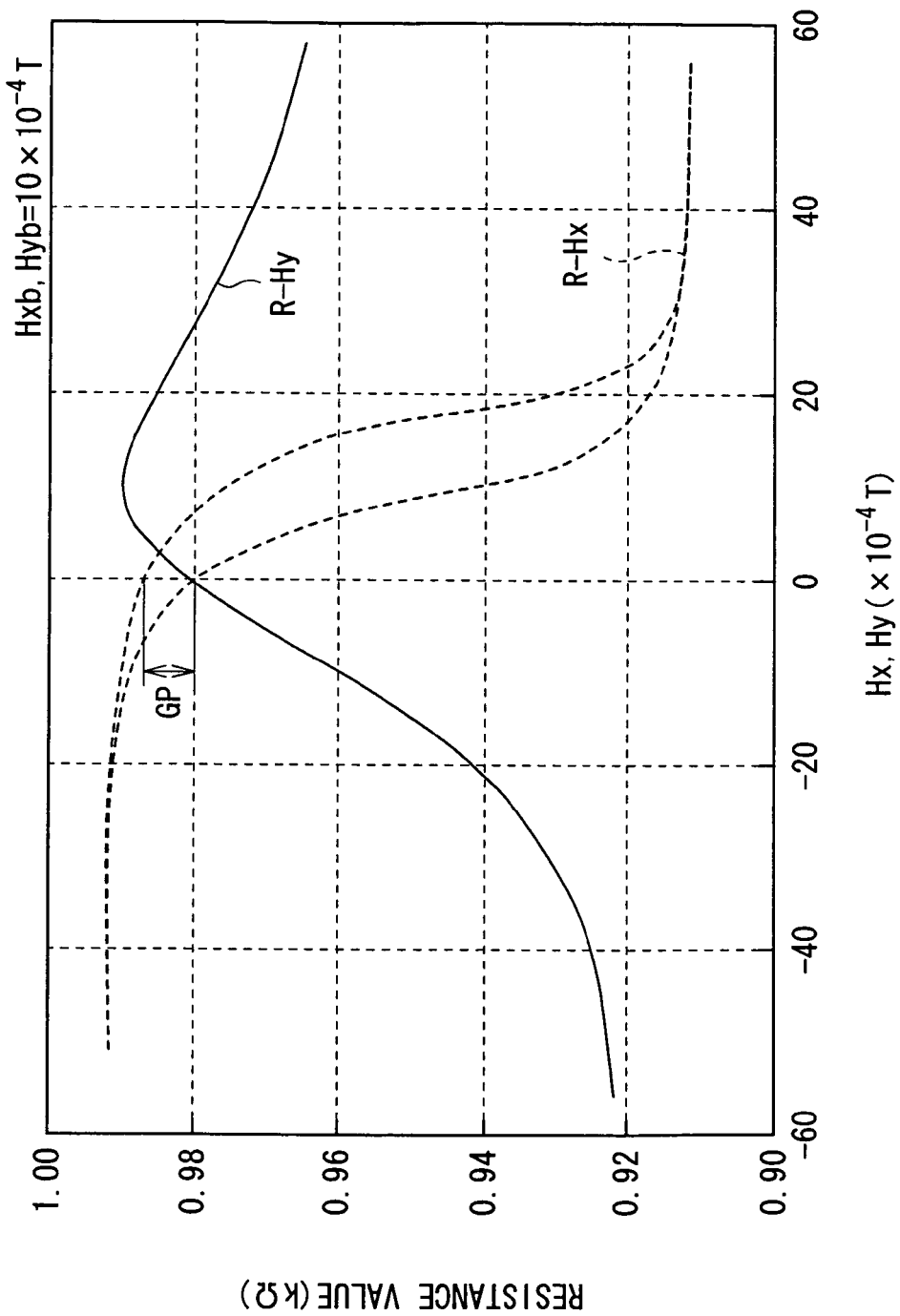
FIG. 10 is a first characteristic diagram showing magnetic field dependency of a resistance value R in the magnetoresistive element of the current sensor illustrated in FIG. 1.
Figure 11:
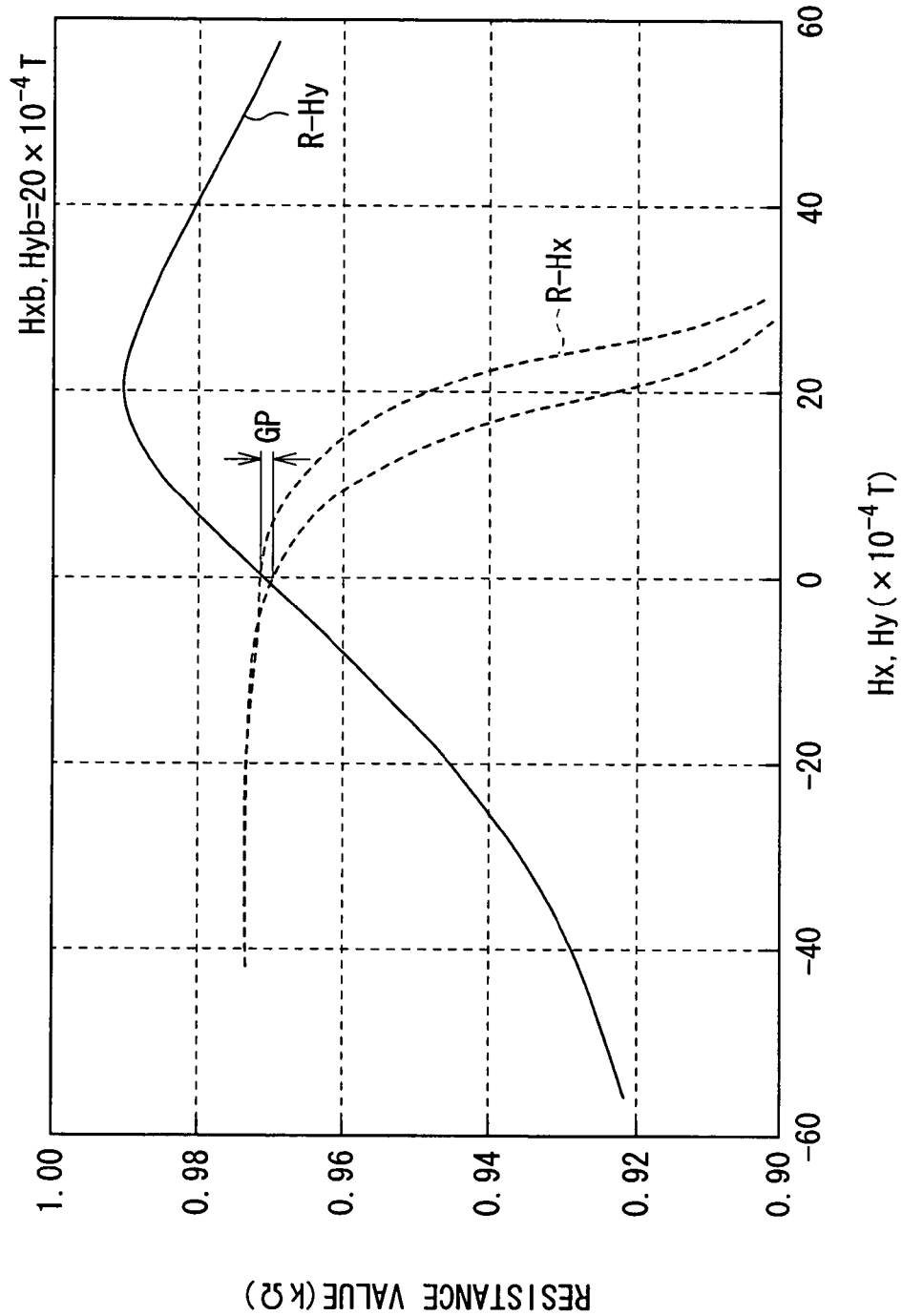
FIG. 11 is a second characteristic diagram showing magnetic field dependency of the resistance value R in the magnetoresistive element of the current sensor illustrated in FIG. 1.
Figure 12:
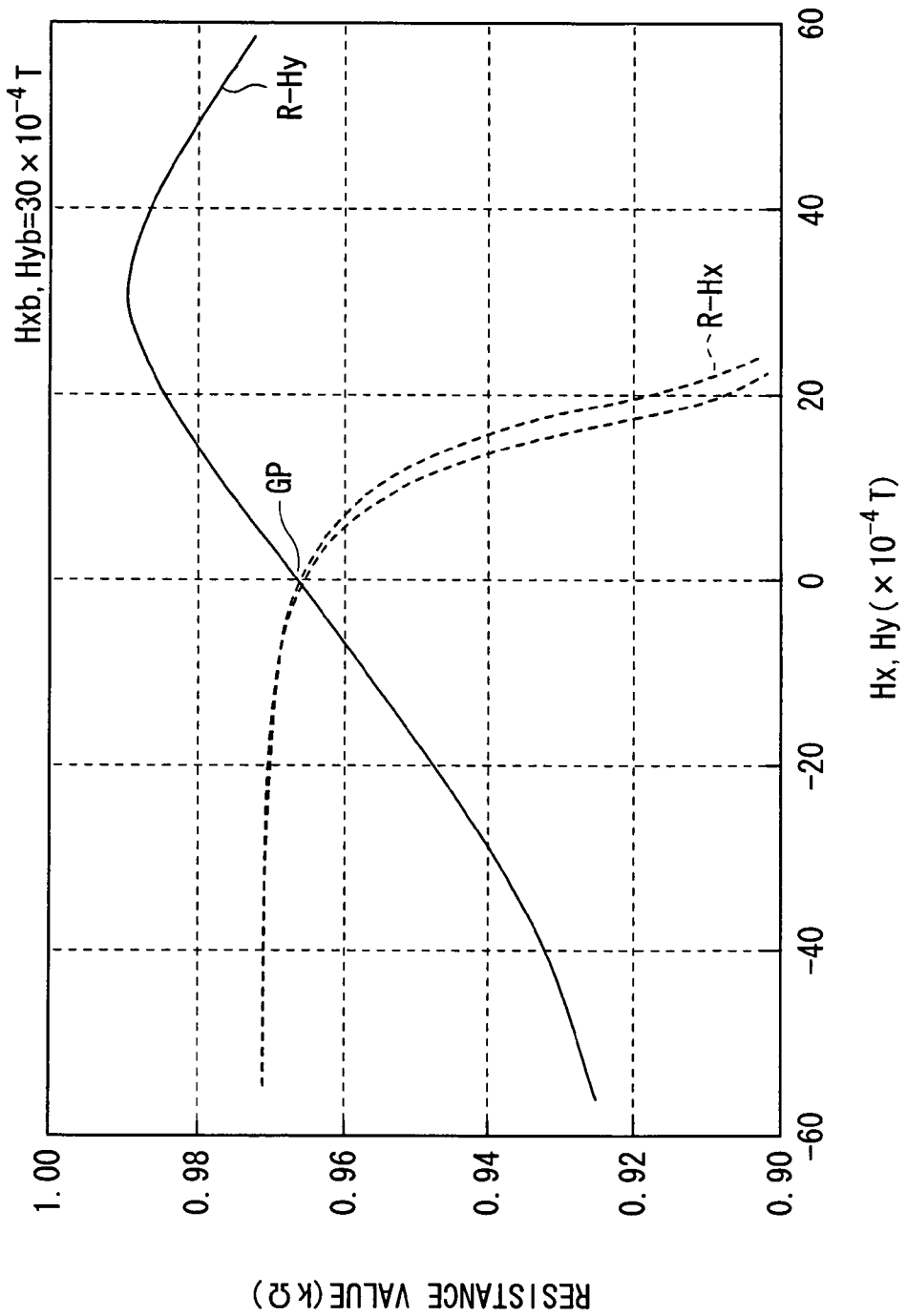
FIG. 12 is a third characteristic diagram showing magnetic field dependency of the resistance value R in the magnetoresistive element of the current sensor illustrated in FIG. 1.
Figure 13:
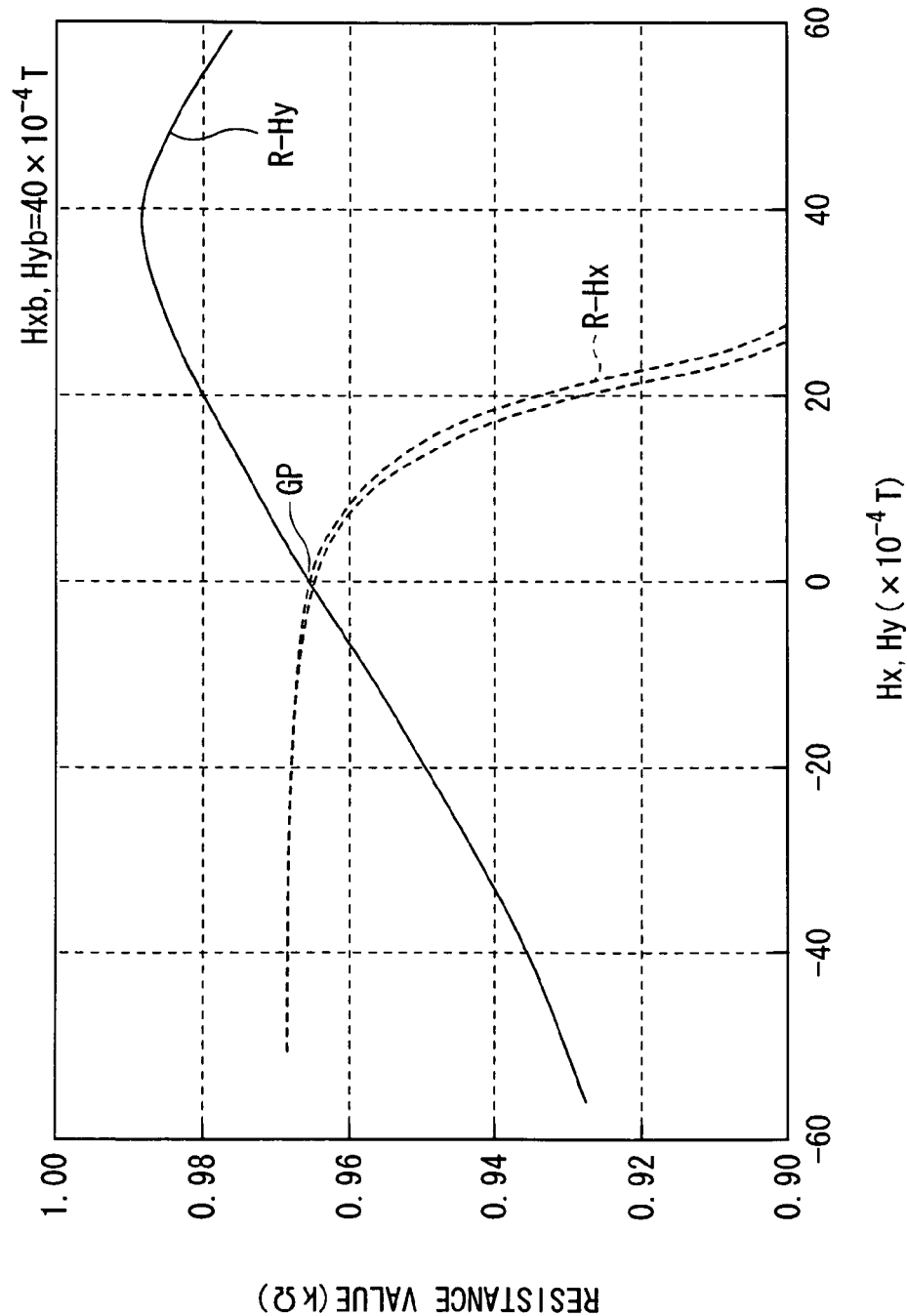
FIG. 13 is a fourth characteristic diagram showing magnetic field dependency of the resistance value R in the magnetoresistive element of the current sensor illustrated in FIG. 1.
Figure 14:
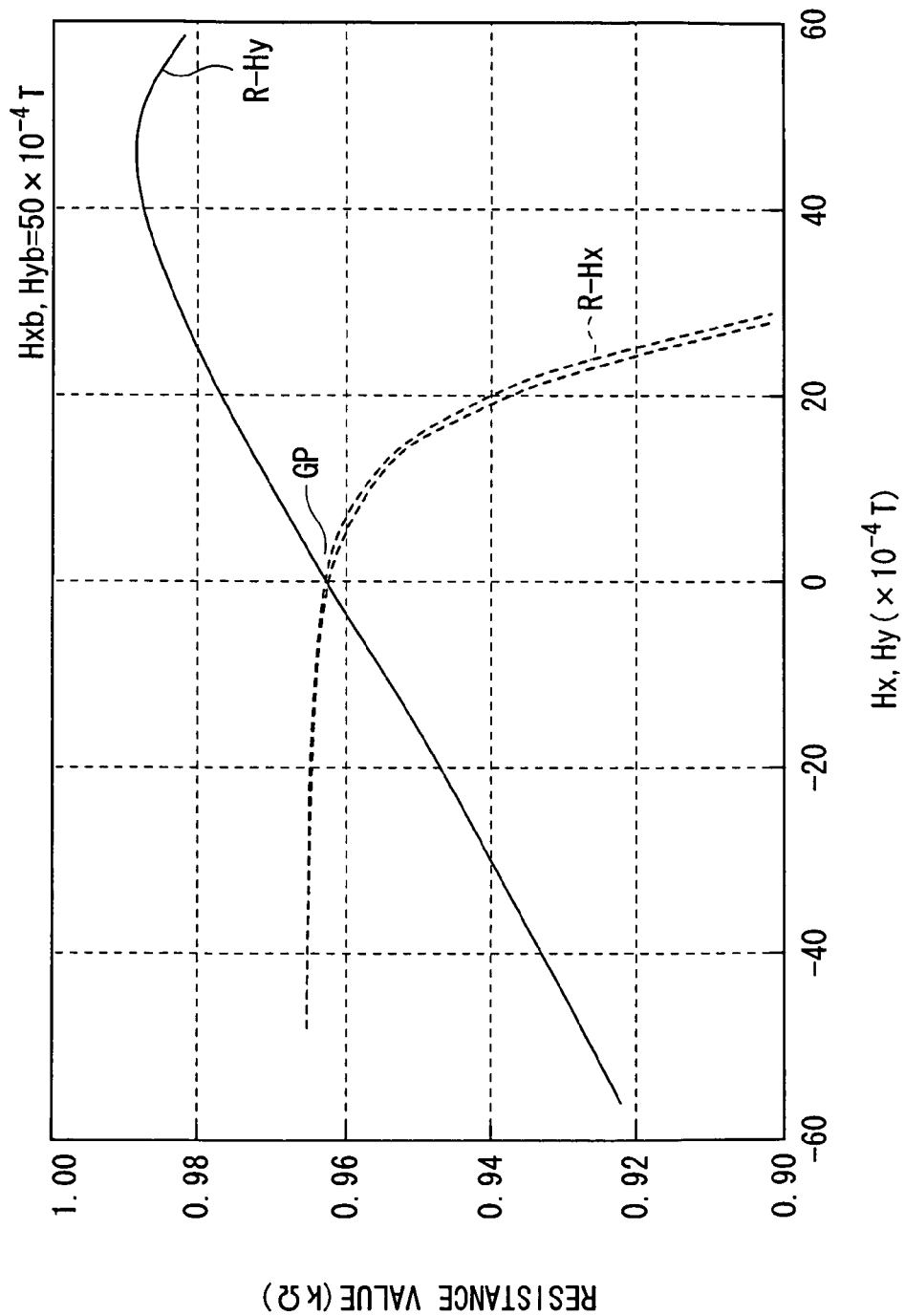
FIG. 14 is a fifth characteristic diagram showing magnetic field dependency of the resistance value R in the magnetoresistive element of the current sensor illustrated in FIG. 1.

In each of FIGS. 10 to 14, the horizontal axis indicates the magnetic flux densities of the magnetic fields Hx and Hy and the vertical axis indicates the resistance value R. In each of diagrams, a change in the resistance value R at the time of applying the magnetic field Hx is indicated by a curve R-Hx and a change in the resistance value R at the time of applying the magnetic field Hy is indicated by a curve R-Hy. FIG. 10 shows results corresponding to the case where each of the parallel component Hxb and the orthogonal component Hyb was set to $10 \times 10^{-4}$ T. Similarly, FIGS. 11 to 14 show results corresponding to the cases where the parallel component Hxb and the orthogonal component Hyb were set to $20 \times 10^{-4}$ T, $30 \times 10^{-4}$ T, $40 \times 10^{-4}$ T, and $50 \times 10^{-4}$ T.

As evident from the results in FIGS. 10 to 14, the resistance values R hardly showed hysteresis for changes in the magnetic fields Hy (that is, changes of the magnetic fields in the induction direction) but showed hysteresis for changes in the magnetic fields Hx in each of the cases. However, by increasing the parallel component Hxb of the bias magnetic field Hb, a deviation in the numerical value when the magnetic field Hx is zero (a gap GP caused by hysteresis) was reduced. A change in the gap GP with respect to the parallel component Hxb is shown in FIG. 15.

Figure 15:
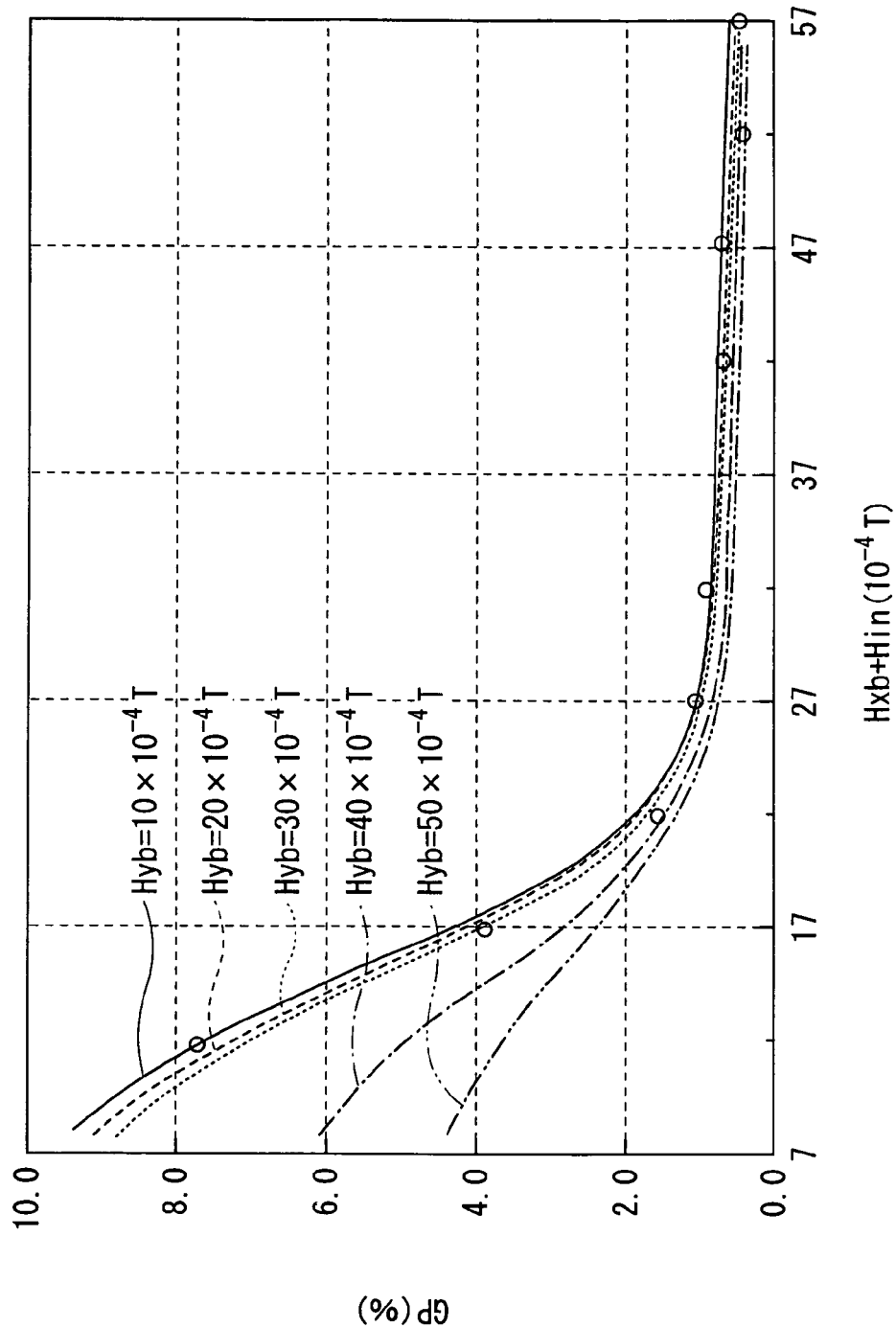
FIG. 15 is a characteristic diagram showing magnetic field dependency of a gap GP due to hysteresis in the magnetoresistive element of the current sensor illustrated in FIG. 1.

In FIG. 15, the horizontal axis shows a magnetic density Hxb+Hin of a composite magnetic field obtained by combining the parallel component Hxb and the exchange bias magnetic field Hin, and the vertical axis shows the gap GP corresponding to FIGS. 10 to 14. The magnetic flux density of the exchange bias magnetic fields Hin was $7 \times 10^{-4}$ T. The case where the orthogonal component Hyb of the bias magnetic fields Hb was set to $10 \times 10^{-4}$ T, $20 \times 10^{-4}$ T, $30 \times 10^{-4}$ T, $40 \times 10^{-4}$ T, and $50 \times 10^{-4}$ is shown. It was understood from the result of FIG. 15 that when the magnetic flux density Hxb+Hin of the composite magnetic field is equal to or higher than $22 \times 10^{-4}$ T, noise which becomes a problem does not occur and high-sensitive and stable sensing can be performed.

Figure 16:
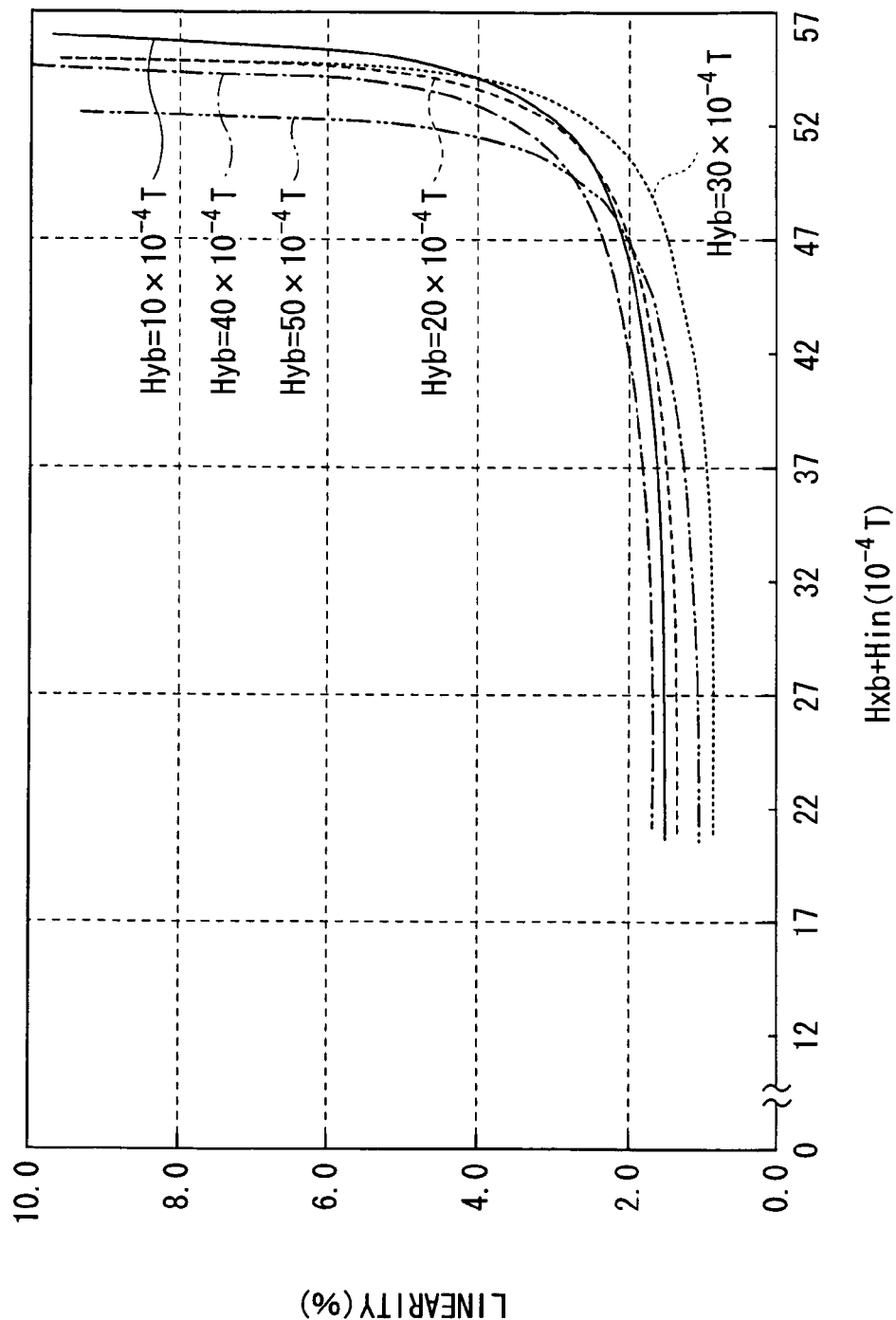
FIG. 16 is a characteristic diagram showing magnetic field dependency of linearity in the magnetoresistive element of the current sensor illustrated in FIG. 1.

FIG. 16 shows the relation between linearity of the compensation current Id (in the current circuit of FIG. 3) and the magnetic flux density Hxb+Hin of the composite magnetic field between the parallel component Hxb and the exchange bias magnetic field Hin. Concretely, the linearity is expressed as follows.

$$(\text{linearity \%}) = [(Im - m \cdot Id)/Im(\text{max})]\text{max} \quad (5)$$

where, Im indicates a current to be detected, Im(max) indicates a maximum current to be detected, and "m" indicates a constant of proportionality that is expressed as Im(max)/Id. In FIG. 16, the horizontal axis indicates the magnetic flux density Hxb+Hin($10^{-4}$ T) of the composite magnetic field obtained by combining the parallel component Hxb and the exchange bias magnetic field Hin, and the vertical axis indicates the linearity (%) computed from Equation (5). The case where the magnetic flux density of the exchange bias magnetic field Hin was set to $7 \times 10^4$ T and the orthogonal component Hyb of the bias magnetic field Hb was set to $10 \times 10^{-4}$ T, $20 \times 10^{-4}$ T, $30 \times 10^{-4}$ T, $40 \times 10^{-4}$ T, and $50 \times 10^{-4}$ T in a manner similar to FIG. 15. It was understood from the result of FIG. 16 that stable linearity can be obtained in each of the cases when the magnetic flux density Hxb+Hin of the composite magnetic field is equal to $52 \times 10^{-4}$ T or less.

Figure 17:
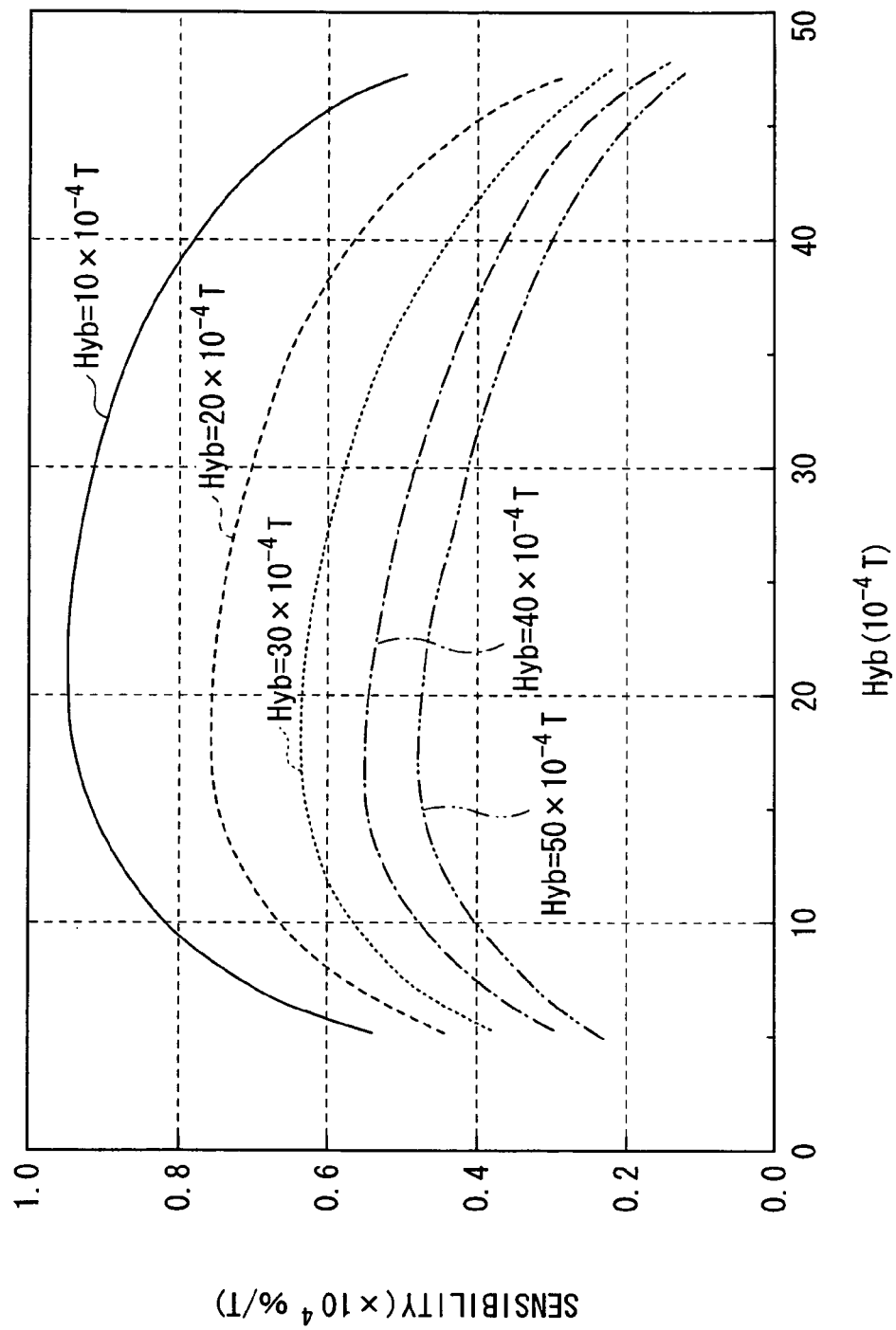
FIG. 17 is a characteristic diagram showing magnetic field dependency of sensibility in the magnetoresistive element of the current sensor illustrated in FIG. 1.

FIG. 17 shows a change in sensibility of the magnetoresistive element. The "sensibility" indicates here a resistance change ratio of the magnetoresistive element, that corresponds to a gradient at the magnetic field Hy=0 in the curve R-Hy shown in each of FIGS. 10 to 14. The horizontal axis indicates the magnetic flux density of the orthogonal component Hyb and the vertical axis indicates the sensibility obtained from FIGS. 10 to 14. FIG. 17 shows the correlation between the magnetic flux density of the orthogonal component Hyb and sensitivity with respect to the case where the parallel component Hxb of the bias magnetic field Hb was set to $10 \times 10^{-4}$ T, $20 \times 10^{-4}$ T, $30 \times 10^{-4}$ T, $40 \times 10^{-4}$ T, and $50 \times 10^{-4}$ T. As a result, it was known that almost constant sensibility can be obtained when the magnetic flux density of the orthogonal component Hyb lies in the range from $15 \times 10^{-4}$ T to $45 \times 10^{-4}$ T.

Although the invention has been described above by the embodiments and the example, the invention is not limited to the foregoing embodiments and the example but can be variously modified. For example, although the magnetoresistive element constructed so that the magnetization direction of the free layer under no magnetic field is parallel to that of the pinned layer is employed, the invention is not limited to the configuration. For example, the magnetoresistive element constructed so that the magnetization direction of the free layer under no magnetic field is orthogonal to that of the pinned layer may be used.

Figure 18:
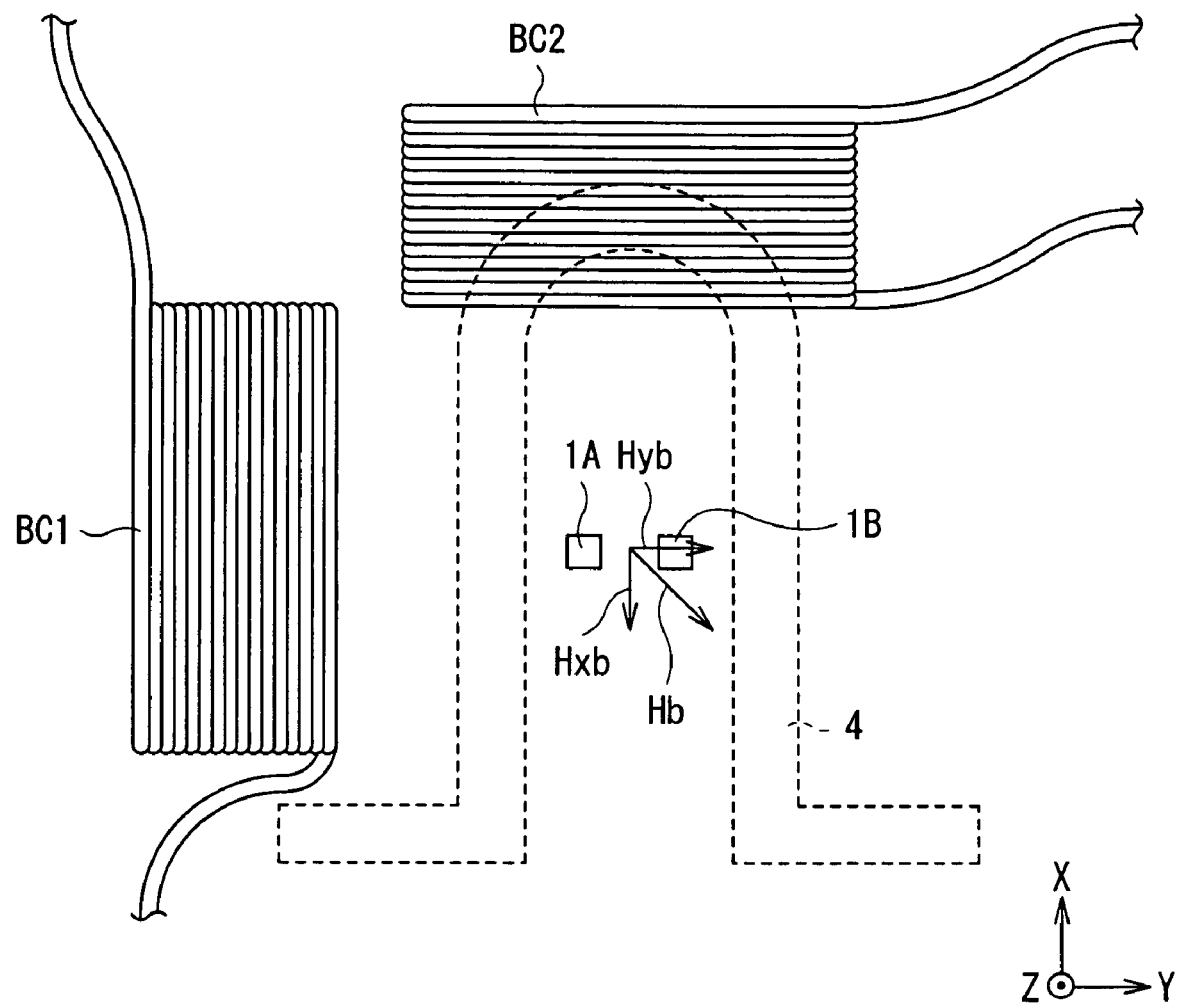
FIG. 18 is a schematic view showing a configuration example as a second modification of the current sensor illustrated in FIG. 1.
Figure 19:
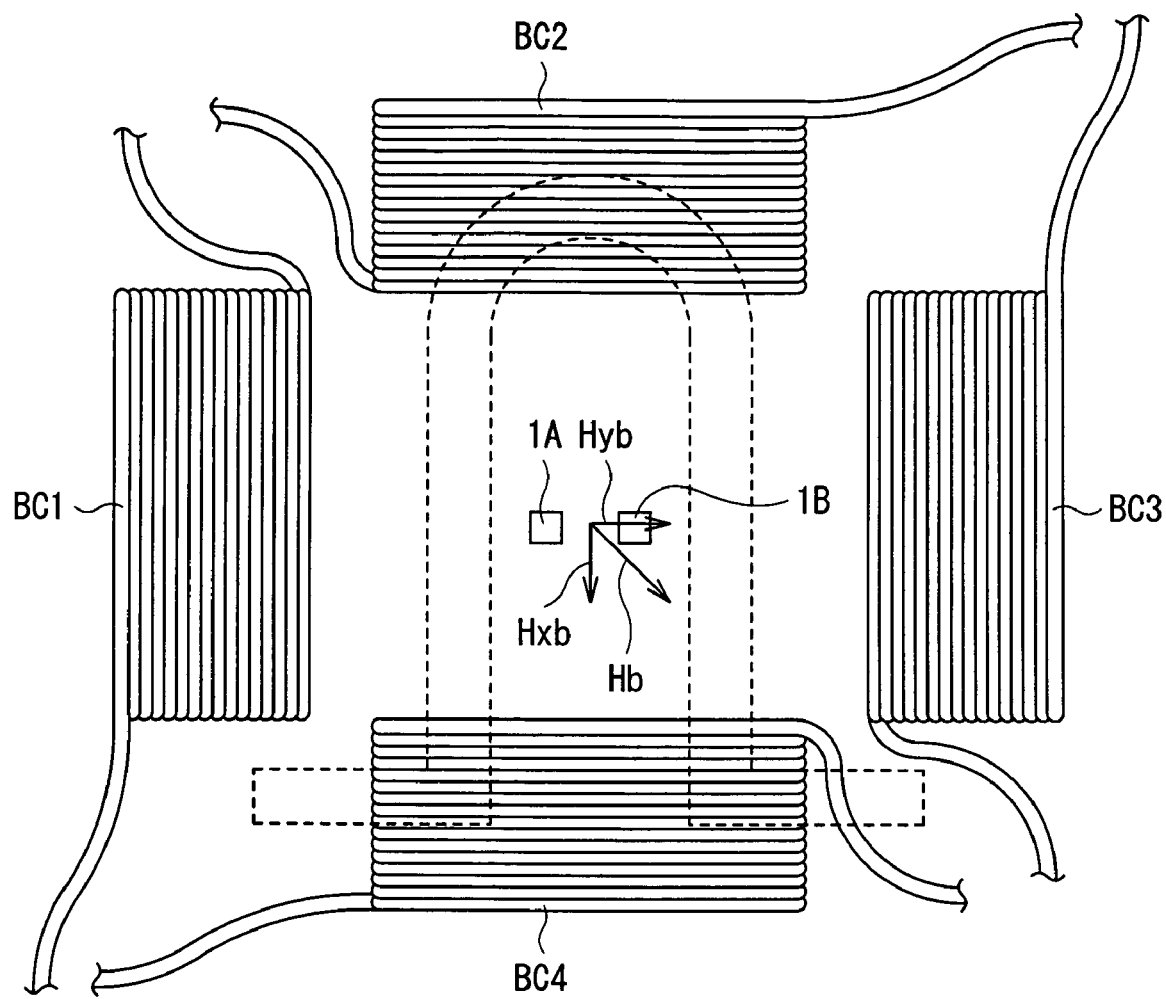
FIG. 19 is a schematic view showing a configuration example as a third modification of the current sensor illustrated in FIG. 1.

Although the permanent magnets are disposed so as to face each other as means for applying the bias magnetic field in the foregoing embodiment and the like, the means is not limited to the magnets. For example, as shown in FIG. 18, solenoid coils BC1 and BC2 (hereinbelow, simply called coils BC1 and BC2) may be provided near the magnetoresistive elements 1A and 1B, respectively. For example, the orthogonal component Hyb may be generated by the coil BC1, the parallel component Hxb may be generated by the coil BC2, and the bias magnetic field Hb as a whole may be applied to the magnetoresistive elements 1A and 1B. In the case, solenoid coils BC3 and BC4 (hereinbelow, simply called coils BC3 and BC4) may be provided so as to face the coils BC1 and BC2, respectively, while sandwiching the magnetoresistive elements 1A and 1B as shown in FIG. 19. With the configuration, a stabler orthogonal component Hyb can be generated by the coils BC1 and BC3, and a stabler parallel component Hxb can be formed by the coils BC2 and BC4.

Although the direction of the exchange bias magnetic field Hin and that of the parallel component Hxb are set to be the same in the foregoing embodiment, the directions may be opposite to each other. However, the case where the directions are set to the same is preferable since the detecting operation becomes stabler.

Although the invention has been described by using, as an example, the current sensor measuring the current magnetic field generated by the current flowing through the conductor in the foregoing embodiment and the like, the invention is not limited to the current sensor. The invention also includes a magnetic sensor detecting a change in a magnetic flux itself in the environment thereof without having a conductor to which current is passed. The magnetic sensor of the invention can be also applied to an eddy current inspection technique for detect a defective in printed wiring and the like. In this case, a number of magnetoresistive elements are disposed linearly on an object and a change in an eddy current is captured as a change in a magnetic flux.

Obviously many modifications and variations of the present invention are possible in the light of the above teachings. It is therefore to be understood that within the scope of the appended claims the invention may be practiced otherwise than as specifically described.

What is claimed is:

1. A magnetic sensor comprising:
 a magnetoresistive element that includes a pinned layer having a magnetization direction pinned in a first direction, a free layer whose magnetization direction changes according to an applied magnetic field, and an intermediate layer sandwiched between the pinned layer and the free layer; and
 a bias applying means applying a bias magnetic field to the magnetoresistive element, a direction of the bias magnetic field being fixed in a second direction that is different from the first direction, the bias magnetic field having a parallel component parallel to the magnetization direction of the free layer under no magnetic field and an orthogonal component orthogonal to the parallel component, wherein
 magnetic flux density of a composite magnetic field lies in the range from $22 \times 10^{-4}$ tesla (T) to $52 \times 10^{-4}$ tesla (T), the composite magnetic field being composed of an exchange bias magnetic field and the parallel component of the bias magnetic field, the exchange bias magnetic field being generated between the pinned layer and the free layer.

2. The magnetic sensor according to claim 1, wherein the bias applying means is either one or more permanent magnets or one or more solenoid coils.

3. The magnetic sensor according to claim 1, wherein the magnetization direction of the free layer under no magnetic field is parallel to that of the pinned layer.

4. The magnetic sensor according to claim 1, wherein the free layer has an axis of easy magnetization parallel to the magnetization direction of the pinned layer.

5. The magnetic sensor according to claim 1, wherein the magnetization direction of the free layer under no external magnetic field is orthogonal to that of the pinned layer.

6. A magnetic sensor comprising:
 a magnetoresistive element that includes a pinned layer having a magnetization direction pinned in a first direction, a free layer whose magnetization direction changes according to an applied magnetic field, and an intermediate layer sandwiched between the pinned layer and the free layer; and
 a bias applying means applying a bias magnetic field to the magnetoresistive element, a direction of the bias magnetic field being fixed in a second direction that is different from the first direction, the bias magnetic field having a parallel component parallel to the magnetization direction of the free layer under no magnetic field and an orthogonal component orthogonal to the parallel component, wherein magnetic flux density of the orthogonal component of the bias magnetic field lies in the range from $15 \times 10^{-4}$ tesla (T) to $4 \times 10^{-4}$ tesla (T).

7. The magnetic sensor according to claim 6, wherein magnetic flux density of a composite magnetic field lies in the range from $22 \times 10^{-4}$ tesla (T) to $52 \times 10^{-4}$ tesla (T), the composite magnetic field being composed of an exchange bias magnetic field and the parallel component of the bias magnetic field, the exchange bias magnetic field being generated between the pinned layer and the free layer.

8. The magnetic sensor according to claim 6, wherein the bias applying means is either one or more permanent magnets or one or more solenoid coils.

9. The magnetic sensor according to claim 6, wherein the magnetization direction of the free layer under no magnetic field is parallel to that of the pinned layer.

10. The magnetic sensor according to claim 6, wherein the free layer has an axis of easy magnetization parallel to the magnetization direction of the pinned layer.

* * * * *